US011393968B2

(12) United States Patent
Magagnin et al.

(10) Patent No.: US 11,393,968 B2
(45) Date of Patent: Jul. 19, 2022

(54) ACTIVE MATERIAL AND ELECTRIC POWER GENERATOR CONTAINING IT

(71) Applicant: TERMO-IND S.A., Chiasso (CH)

(72) Inventors: Luca Magagnin, Rho (IT); Simona Ieffa, Valmorea (IT); Alessandra Accogli, Diso (IT); Gabriele Panzeri, Cornate d'Adda (IT); Francesco Liberale, Pavia (IT); Vincenzo Tirella, Coldrerio (CH); Luca Succa, Rome (IT); Simone Brunetti, Rome (IT)

(73) Assignee: TERMO-IND S.A., Chiasso (IT)

( * ) Notice: Subject to any disclaimer, the term of this patent is extended or adjusted under 35 U.S.C. 154(b) by 165 days.

(21) Appl. No.: 16/324,816

(22) PCT Filed: Aug. 7, 2017

(86) PCT No.: PCT/EP2017/069925
§ 371 (c)(1),
(2) Date: Feb. 11, 2019

(87) PCT Pub. No.: WO2018/029139
PCT Pub. Date: Feb. 15, 2018

(65) Prior Publication Data
US 2019/0172992 A1 Jun. 6, 2019

(30) Foreign Application Priority Data
Aug. 10, 2016 (WO) .................. PCT/EP2016/069030

(51) Int. Cl.
*H01L 35/22* (2006.01)
*H01L 35/34* (2006.01)
*H01L 35/04* (2006.01)

(52) U.S. Cl.
CPC .............. *H01L 35/22* (2013.01); *H01L 35/04* (2013.01); *H01L 35/34* (2013.01)

(58) Field of Classification Search
None
See application file for complete search history.

(56) References Cited

U.S. PATENT DOCUMENTS 5,498,406 A * 3/1996 Nearn ...................... A61K 8/02
424/59
2008/0268382 A1 10/2008 Tanaka et al.
(Continued)

FOREIGN PATENT DOCUMENTS

CN 103992747 A * 8/2014
EP 09242721 A1 6/1999
(Continued)

OTHER PUBLICATIONS

English machine translation of Bai et al. (CN 103992747 A) provided by the EPO website. All Pages. 2021. (Year: 2021).*
(Continued)

*Primary Examiner* — Daniel P Malley, Jr.
(74) *Attorney, Agent, or Firm* — Troutman Pepper Hamilton Sanders LLP (Rochester)

(57) ABSTRACT

The invention relates to an active material comprising at least one oxygen containing compound selected from the group consisting of MgO, ZnO, ZrOCl$_2$, ZrO$_2$, SiO$_2$, Bi$_2$O$_3$, Al$_2$O$_3$ and TiO$_2$, at least one thickener additive selected from the group consisting of agar agar, xanthan gum, methylcellulose, and arabic gum, and at least one plasticizer additive, wherein the particle size of the at least one oxygen-based compound has an average diameter in the range from 10 nm to 40 µm. The invention concerns also an electric power generator (EPG) comprising at least a first electrode (11) and a second electrode (12), wherein the electric power generator comprises the active material between said electrodes (11,12).

23 Claims, 9 Drawing Sheets

(56) References Cited

U.S. PATENT DOCUMENTS

| | | | |
|---|---|---|---|
| 2011/0006249 A1* | 1/2011 | Chen | H01L 35/34 252/73 |
| 2011/0017254 A1* | 1/2011 | Stefan | B23K 35/3006 136/230 |
| 2011/0100410 A1* | 5/2011 | Takahashi | C23C 14/35 136/237 |
| 2012/0111409 A1 | 5/2012 | Kim et al. | |
| 2017/0125658 A1* | 5/2017 | Funahashi | C22C 5/06 |
| 2018/0090655 A1* | 3/2018 | Santamaria Razo | H01L 35/24 |
| 2019/0058101 A1* | 2/2019 | Oi | H01L 35/34 |
| 2019/0382561 A1* | 12/2019 | Janowska | C08L 5/12 |

FOREIGN PATENT DOCUMENTS

| | | |
|---|---|---|
| EP | 2902518 A2 | 8/2015 |
| JP | 2004203726 A | 7/2004 |
| JP | 201658475 A * | 4/2016 |
| JP | 2016-079348 A | 5/2016 |
| WO | 2016/035454 A1 | 3/2016 |

OTHER PUBLICATIONS

English machine translation of Takahashi (JP 2016-58475 A) provided by the EPO website. All Pages. 2021. (Year: 2021).*
PCT International Search Report and Written Opinion for corresponding PCT/EP2017/069925, dated Sep. 29, 2017.
PCT International Search Report and Written Opinion for corresponding PCT/EP2016/069030, dated Jan. 9, 2017.

* cited by examiner

ACTIVE MATERIAL AND ELECTRIC POWER GENERATOR CONTAINING IT

This application is a national stage application under 35 U.S.C. § 371 of PCT Application No. PCT/EP2017/069925, filed 7 Aug. 2017, which claims priority of PCT International Application No. PCT/EP2016/069030, filed 10 Aug. 2016, which are hereby incorporated by reference in their entirety.

FIELD OF THE INVENTION

The present invention relates to an active material to be used for the manufacturing of an electric generator and to a method for obtaining such medium. The present invention hence relates also to an electric generator comprising said active material.

STATE OF THE ART

It is widely known the use of thermoelectric power generators and thermionic power generators for the conversion of thermal energy directly into electrical energy.

The thermoelectric power generators are devices based on a thermoelectric effect, namely the Seebeck effect, involving interactions between the flow of heat and of electricity between solid bodies. Examples of such devices are disclosed in the patent EP 2521192 and in the patent application EP 2277209. In broad terms, thermoelectric power generators consist of three main components: thermoelectric material, thermoelectric modules and thermoelectric system that interface with a heat source.

Thermoelectric materials generate power directly from heat by converting temperature differences into electric voltage. In particular, these materials typically have both high electrical conductivity and low thermal conductivity. The low thermal conductivity ensures that when one side is made hot, the other side stays cold. This helps to generate a large voltage while in a temperature gradient.

A thermoelectric module is a circuit containing thermoelectric materials which generate electricity from heat directly. A module consists of two dissimilar thermoelectric materials joining at their ends, namely a negatively charged semiconductor and a positively charged semiconductor. A direct electric current will flow in the circuit when there is a temperature gradient between the two materials. Such gradient is provided by the thermoelectric system which typically comprise heat exchangers used on both sides on the module to supply respectively heating and cooling.

A thermionic power generators, also called thermionic power converters, convert heat directly into electricity. A thermionic power generator typically comprises two electrodes arranged in a containment. One of these is raised to a sufficiently high temperature to become a thermionic electron emitter or "hot plate". The other electrode is called collector because it receives the emitted electrons. The collector is operated at significantly lower temperature. The space between the electrodes can be vacuum or alternatively filled with a vapour gas at low pressure. The thermal energy may be supplied by chemical, solar or nuclear sources.

Thermoelectric power generators as well as thermionic power generators have many drawbacks, among which the low conversion efficiency and the need of providing a temperature gradient. In addition, such generators, requires relatively constant thermal source.

Therefore, it is the primary object of the present invention to provide an electric power generator capable to convert part of the thermal energy in electric energy and allowing to overcome the drawbacks of the devices of the prior art

SUMMARY OF THE INVENTION

The inventors surprisingly found out a new active material capable to be applied on one electrode and to generate current when comprised between at least two electrodes without initial charging and dependently on the temperature.

Therefore, the present invention relates to an active material comprising at least one oxygen-containing compound selected from the group consisting of $MgO$, $ZnO$, $ZrOCl_2$, $ZrO_2$, $SiO_2$, $Bi_2O_3$, $Al_2O_3$ and $TiO_2$, at least one thickener additive selected from the group consisting of agar agar, xanthan gum, methylcellulose, and arabic gum, and at least one plasticizer additive, wherein the particle size of the at least one oxygen-based compound has an average diameter in the range from 10 nm to 40 µm.

In the present invention when the term "plasticizer additive" is used, it is meant a substance capable to produce or promote plasticity when added, for example silicone, siloxanes or Carnauba Wax, but Naphtalene, PVDF, Parylene, PTFE, FEP, and PDMS can also be contemplated.

In the present invention when it is referred to the "particle size" of the at least one oxygen-based compound it is meant the average diameter of said particle as measured with Scanning Electron Microscope (SEM), Transmission Electron Microscope (TEM) or Dynamic Light Scattering (DLS).

In a preferred embodiment of the invention the active material comprises $MgO$, $ZnO$ and $ZrO_2$ as oxygen-containing compounds, agar agar, Xanthan gum, methylcellulose as thickener additives and silicone as plasticizer additive.

In another aspect the invention concerns a process for preparing the active material comprising the following steps:
a) preparing a solution with a solvent selected from the group consisting of water, ethylene glycol, glycerin, dimethyl sulfoxide and relative mixtures of at least one oxygen-containing compound selected from the group consisting of $MgO$, $ZnO$, $ZrOCl_2$, $ZrO_2$, $SiO_2$, $Bi_2O_3$, $Al_2O_3$ and $TiO_2$;
b) heating the solution of step a) at a temperature in the range from 75 to 90°;
c) adding at least one thickener additive selected from the group consisting of agar agar, xanthan gum, methylcellulose and arabic gum, thus obtaining a homogeneous solution;
d) cooling down the homogenous solution of step c) to a temperature in the range from 30° C. to 15° C. allowing gelation, thus obtaining a gelled material;
e) adding at least one plasticizer to the gelled material, thus obtaining the active material,
wherein the particle size of the at least one oxygen-based compound has an average diameter in the range from 10 nm to 40 µm. In a still another aspect the invention concerns an alternative process for preparing the active material comprising the following steps
i) preparing a first solution with a solvent selected from the group consisting of water, ethylene glycol, glycerin, dimethyl sulfoxide and relative mixtures of at least one oxygen-containing compound selected from the group consisting of $MgO$, $ZnO$, $ZrOCl_2$, $ZrO_2$, $SiO_2$, $Bi_2O_3$, $Al_2O_3$ and $TiO_2$;
ii) heating the first solution of step i) at a temperature in the range from 90 to 110° C.;
iii) cooling down the homogenous solution of step ii) to a temperature in the range from 50° C. to 30° C.;
iv) preparing a second solution with a solvent selected from the group consisting of water, ethylene glycol, glycerin, dimethyl sulfoxide and relative mixtures of at least one thickener additive selected from the group consisting of agar agar, xanthan gum, methylcellulose, and arabic gum
v) heating the second solution of step iv) at a temperature in the range from 90 to 120° C.;
vi) mixing the first solution at 45° C. with the solution at step v);
vii) cooling down the homogenous solution of step vi) to a temperature in the range from 30° C. to 20° C. and subjecting it to cooling cycles from ambient temperature to −18° C.;
viii) adding at least one plasticizer additive to the solution of step vii), thus obtaining an homogenous material solution;
ix) optionally removing the solvent, and obtaining the active material,
wherein the particle size of the at least one oxygen-based compound has an average diameter in the range from 10 nm to 40 µm. In another aspect, the invention relates to an electric power generator (EPG) comprising at least two electrodes, placed at a suitable distance from each other and preferably made of different material. The EPG comprises active material according to the invention between the at least two electrodes. The electrodes are made of metals, alloys and/or carbon-based materials like graphite. Electrodes thickness ranges preferably from 0.1 to 3000 µm, more preferably from 50 to 1000 µm, still more preferably from 300 to 600 µm. In a preferred embodiment of the EPG according to the invention, the at least two electrodes are made of Cu and Al, preferably in form of plates or foils substantially parallel. In case of flexible EPG both self-standing flexible materials (among the previous listed materials) and metallized polymers can be considered as electrodes.

The present invention also relates to a power generator module (PGM) comprising a plurality of EPG which can be connected in series or parallel without comprising the EPG characteristics (voltage and current).

DESCRIPTION OF FIGURES

Further features and advantages of the invention will be more apparent in light of the detailed description of the active material and of the preferred embodiments of the electric power generator with the aid of enclosed drawings in which.

The same numbers in the Figures correspond to the same elements or components.

DETAILED DESCRIPTION OF THE INVENTION

Figure 1:
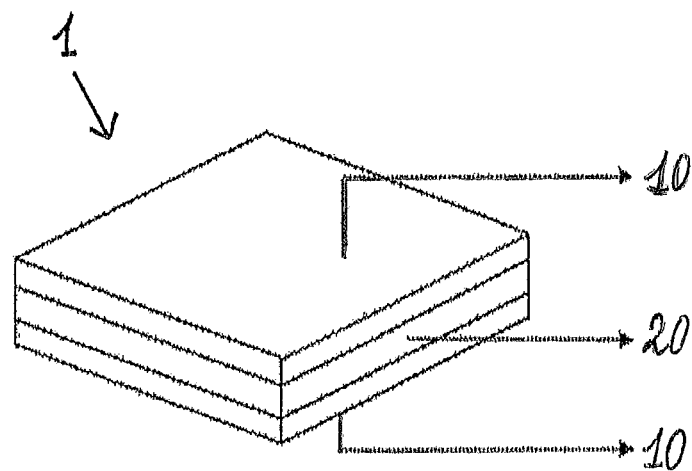
FIG. 1 shows the sandwich structure of the electric power generator comprising the active material according to the present invention.

The present invention hence relates to an active material comprising at least one oxygen-containing compound selected from the group consisting of MgO, ZnO, $ZrOCl_2$, $ZrO_2$, $SiO_2$, $Bi_2O_3$, $Al_2O_3$ and $TiO_2$, at least one thickener additive selected from the group consisting of agar agar, xanthan gum, methylcellulose, and arabic gum, and at least one plasticizer additive, wherein the particle size of the at least one oxygen-based compound has an average diameter in the range from 10 nm to 40 µm. In the active material of the invention the at least one oxygen-containing compound selected from the group consisting of MgO, ZnO, $ZrOCl_2$, $ZrO_2$, $SiO_2$, $Bi_2O_3$, $Al_2O_3$ and $TiO_2$ and having a particle size corresponding to an average diameter in the range from 10 nm to 40 µm, is present.

Particles size of oxygen-based compounds have an average diameter in the range from 10 nm to 40 µm, preferably in the range of 15 nm-10 µm, more preferably 20 nm-5 µm. More preferably, the particles size of oxygen-based compounds have an average diameter in the range from 10-200 nm, still more preferably in the range of 15-100 nm, still more preferably 20-40 nm.

The active material comprises preferably magnesium oxide as oxygen-containing compound, more preferably in the weight percentage in the range from 3% and 17%, preferably 10% with respect to the total weight of the active material.

The active material preferably comprises MgO together with both ZnO and $ZrO_2$ as oxygen-containing compounds, more preferably each one in the weight percentage in the range from 0.7% and 10%, still more preferably 3.7% with respect to the total weight of the active material.

The active material comprises at least one thickener additive selected from the group consisting of agar agar, xanthan gum, methylcellulose, and arabic gum. Preferably, the active material comprises agar agar, Xanthan gum, and/or methylcellulose as thickener additives, more preferably each one in the weight percentage in the range from 0.19% and 6.5%, still more preferably 0.84% with respect to the total weight of the active material.

The active material comprises also at least one plasticizer additive. The at least one plasticizer additive is preferably selected from the group consisting of silicone, siloxanes, Carnauba Wax, Naphtalene, PVDF, Parylene, PTFE, FEP and PDMS. Without being bound to any theory, the inventors reasonably thought that the combined use of these materials, i.e. the at least one plasticizer with the oxygen-containing compounds of the invention could enhance the performances of materials and hence of the electric power generator containing it, thus improving the results obtained under particular regimes.

More preferably the at least one plasticizer is silicone, still more preferably in an amount in the range from 5 to 40%, preferably 12.5% and 37.5%, still more preferably 33.3% by weight with respect to the total weight of the gelled material. The active material comprises also at least one plasticizer additive with respect to the weight of the gelled material in the range from 1:4 to 3:2, still more preferably in a ratio of 1:3.

The active material can comprise further compounds, preferably Antrachene, PZT materials, and $Si_3N_4$.

The active material can be anhydrous or can contain a certain amount of the water deriving from the process for preparing it. In preferred embodiment, the process provides for eliminating the excess water, thus guaranteeing that it still present, as absorbed coordinated water, in a percentage of at least 1% respect to the final active material's total mass.

The inventors deem that such a percentage of coordinated water in the final active material can ameliorate the performances of the final devices obtained by incorporating the active material. The active material can also contain further additives. Additives may be water coordination additives, casein can be cited.

In a preferred embodiment of the invention, the active material comprises MgO, ZnO, $ZrO_2$ as oxygen-compounds, agar agar, Xanthan gum, methylcellulose as thickener additives and silicone as plasticizer additive, wherein the particle size of the at least one oxygen-based compound has an average diameter in the range from 10 nm to 40 μm.

In another aspect, the invention concerns a process for preparing the active material comprising the following steps:
a) preparing a solution with a solvent selected from the group consisting of water, ethylene glycol, glycerin, dimethyl sulfoxide and relative mixtures of at least one oxygen-containing compound selected from the group consisting of MgO, ZnO, $ZrOCl_2$, $ZrO_2$, $SiO_2$, $Bi_2O_3$, $Al_2O_3$ and $TiO_2$;
b) heating the solution of step a) at a temperature in the range from 75 to 90° C.;
c) adding at least one thickener additive selected from the group consisting of agar agar, xanthan gum, methylcellulose, and arabic gum thus obtaining a homogeneous solution;
d) cooling down the homogenous solution of step c) to a temperature in the range from 30° C. to 15° C., thus obtaining a gelled material;
e) adding at least one plasticizer additive selected from the group consisting of silicone, thus obtaining the active material,
wherein the particle size of the at least one oxygen-based compound has an average diameter in the range from 10 nm to 40 μm.

Step a) of the process of the invention provides for preparing a solution of a solvent selected from the group consisting of water, ethylene glycol, glycerin, dimethyl sulfoxide and relative mixtures, preferably water, of at least one oxygen-containing compound selected from the group consisting of MgO ZnO, $ZrOCl_2$, $ZrO_2$, $SiO_2$, $Bi_2O_3$, $Al_2O_3$ and $TiO_2$ preferably by stirring during the addition of the components. More preferably the addition of the components, while stirring is carried out in sequence.

In step b) the solution of step a) is heated at a temperature range from 75 to 90° C. After the heating in step c) at least one thickener additive selected from the group consisting of agar agar, xanthan gum, methylcellulose, and arabic gum is added. Further additives can be also added, for example casein. In the preferred embodiment of the invention step c) provides for the addition of agar agar, Xanthan gum and methylcellulose, advantageously in a simultaneous way. After the addition of the at least one thickener additive a homogenous solution is obtained preferably by stirring.

In step d) the homogenous solution of step c) is cooled down to a temperature in the range from 30° C. to 15° C., thus obtaining a gelled material.

In step e) the at least one plasticizer additive, for instance silicone, siloxanes or Carnauba Wax, is added, preferably by stirring to the gelled material.

In a still another aspect the invention concerns an alternative process for preparing the active material comprising the following steps
i) preparing a first solution with a solvent selected from the group consisting of water, ethylene glycol, glycerin, dimethyl sulfoxide and relative mixtures of at least one oxygen-containing compound selected from the group consisting of MgO, ZnO, $ZrOCl_2$, $ZrO_2$, $SiO_2$, $Bi_2O_3$, $Al_2O_3$ and $TiO_2$;
ii) heating the first solution of step i) at a temperature in the range from 90 to 110° C.;
iii) cooling down the homogenous solution of step ii) to a temperature in the range from 50° C. to 30° C.;
iv) preparing a second solution with a solvent selected from the group consisting of water, ethylene glycol, glycerin, dimethyl sulfoxide and relative mixtures of at least one thickener additive selected from the group consisting of agar agar, xanthan gum, methylcellulose and arabic gum;
v) heating the second solution of step iv) at a temperature in the range from 90 to 120° C.;
vi) mixing the first solution at 45° C. with solution at step v);
vii) cooling down the homogenous solution of step vi) to a temperature in the range from 30° C. to 20° C. and subjecting it to cooling cycles from ambient temperature to −18° C.;
viii) adding at least one plasticizer additive to the solution of step vii), thus obtaining a homogenous material solution;
ix) optionally removing the solvent, and obtaining the active material, wherein the particle size of the at least one oxygen-based compound has an average diameter in the range from 10 nm to 40 μm.

The steps iv) and v) can optionally be repeated before the mixing step (vi) by preparing a third or more solutions with the addition of a further thickener additive selected from the group consisting of agar agar, xanthan gum, methylcellulose, and arabic gum.

Optional additives such as casein can be added in anyone of the solutions above cited in the process.

The process of the invention allows to obtain the active material having a viscosity in the range from 5000 to 100000 centipoise, preferably from 5000 to 40000 centipoise, more preferably from 10000 to 20000 centipoise, as measured with the rotatory viscometer Viscotester VTRS at rpm=20 at T=25° C.

In another aspect, the invention relates to an electric power generator (EPG) comprising at least two electrodes, placed at a suitable distance from each other. The EPG comprises the active material according to the invention between the at least two electrodes.

The active material and/or the oxygen-based compounds can be placed on at least one electrode according to any suitable known application method in the art, for example doctor blade, electrophoresis, spin-coating, inkjet printing, sol-gel, thermal spray, sputtering, plasma and any physical or chemical vapour deposition techniques.

The electrodes are made of metals, alloys and/or carbon-based materials like graphite. Electrodes thickness ranges preferably from 0.1 to 3000 μm, more preferably from 50 to 1000 μm, still more preferably from 300 to 600 μm. In a preferred embodiment of the EPG according to the invention, the at least two electrodes are made of Cu and Al, preferably in form of plates or foils substantially parallel. In case of flexible EPG both self-standing flexible materials (among the previous listed materials) and metallized polymers can be considered as electrodes.

In a preferred embodiment of the EPG 1 schematically shown in FIG. 1, the at least two electrodes have a plate-shape. The two plates 10 are arranged substantially parallel each other so as to define a gap filled with the active material 20 of the invention according to a "sandwich structure". The distance of the plates 10 depends directly on the desired thickness of the active material to be applied.

The shape of the electrodes is not binding. In an alternative embodiment, for example, the EPG could comprise two coaxial cylindrical electrodes that define an annular space filled with the active material according to the invention. According to the invention, the EPG could comprise more than two electrodes wherein two adjacent electrodes define a gap filled with the active material.

According to a preferred embodiment, the at least two electrodes are made of different material, preferably of Cu and Al. The two at least electrodes are preferably subjected to cleaning and etching prior to be used in the electric power generator of the invention.

The active material is preferably applied on the electrode, by depositing the active material in a thickness from 100 nm to 5 mm. To now, the best results, using a load of 100 Ohm, have been observed with a thickness of 2 mm. On the other hand, the optimal thickness varies depending on the energy required from the device.

The active material can be deposited on the surface of the electrode with doctor blade technique or similar. Once the EPG is assembled with the active material comprised between the at least two electrodes, the EPG is preferably subjected to a heating step, more preferably at about 80° C., in order to obtain a solid sandwich structure.

Figure 1A:
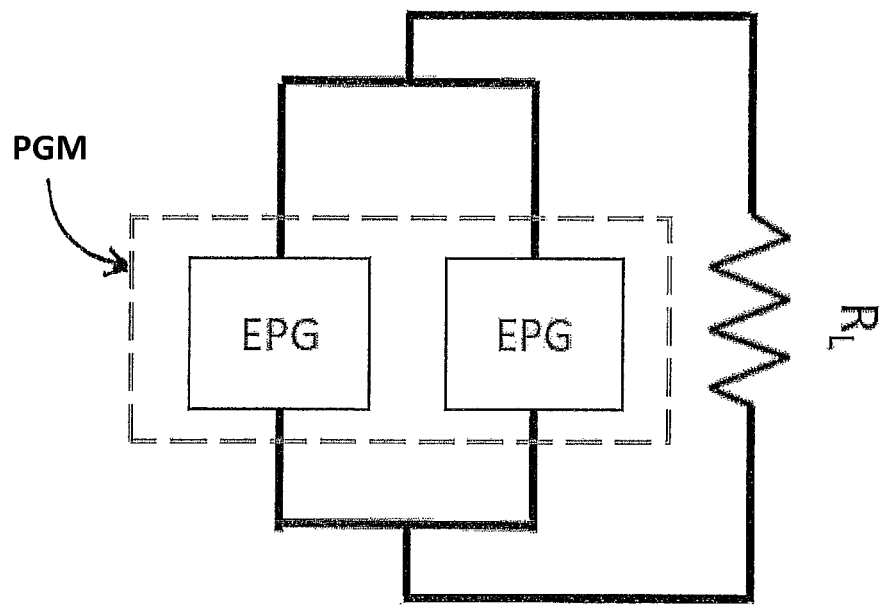
Figure 1B:
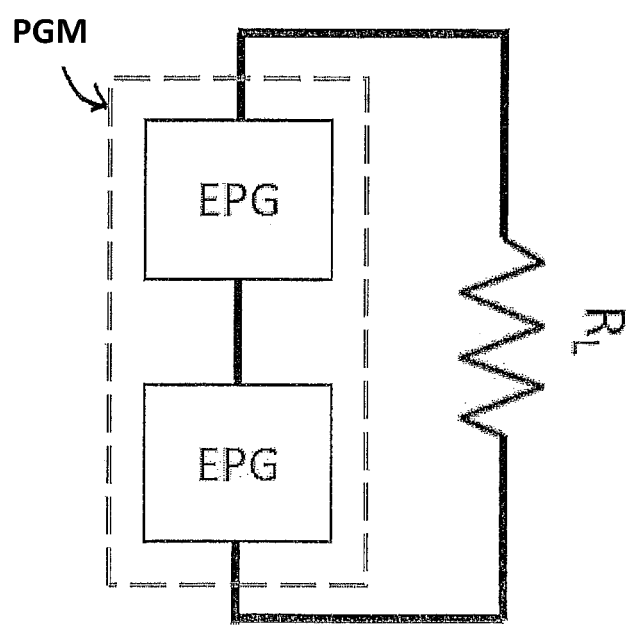

In a further aspect, the invention relates to a power generator module (PGM) comprising a plurality of EPGs which can be connected in series or parallel. On this regards, FIG. 1A shows a circuit comprising a PGM wherein the two EPG are connected in parallel, while FIG. 1B shows a circuit comprising a PGM having two EPG connected in series. Both the circuits of FIGS. 1A and 1B comprise a load resistance $R_L$. The voltage relative to the PGM can be monitored, for example, by connecting a galvanostat parallel to the load resistance $R_L$.

In an even further embodiment of the invention, inventors deem that the proposed active material could be reasonably integrated in the mix of active materials adopted for the manufacturing of commonly used capacitors.

Therefore in another aspect the invention concerns the use of the active material of the invention for manufacturing capacitors.

In view of the properties shown by the active material of the invention, in a still further aspect the invention relates to a use of the active material as dielectric material.

As it will be evident from the following experimental part the EPG of the invention is capable to generate current as soon as it has been assembled, thus being a different device from a conventional capacitor. Furthermore and surprisingly, the performances of the EPG of the invention have a strongly dependence on temperature, i.e. potential difference increases with the temperature. In particular, with respect to the traditional power generators of the prior art, the EPG according to the invention does not require a temperature gradient. Indeed, the electric power generator of the invention is able to convert part of the thermal energy in electric energy even an isotherm condition. Specifically and advantageously, the current measured by the electric power generator of the invention increased by a factor of 6-10, increasing the temperature from 20 to 80° C.

Furthermore, as it will also evident from the following experimental part that the EPC is able to supply a capacitor comprised in a suitable electrical circuit. In particular, the latter comprises an EPG according to the invention, a capacitor, a resistor and a switch.

In a first switching state, the switch connects said capacitor in series with said EPG so as to charge the capacitor up to an equilibrium voltage. When the switch is in a second switching state, it connects the capacitor in series with the resistor to discharge the capacitor. In this last condition, the EPG is electrically isolated. When the switch returns in the first switching state, the EPG is ready to charge newly the capacitor for a subsequent charge-discharge cycle.

Advantageously, in the above electrical circuit, the EPG could be replaced by a PGM.

The invention will now be illustrated by some not limitative examples of the active material and of electric power generator of the invention.

EXAMPLES

Example 1

Preparation of the Active Material of the Invention

In order to prepare the active material the following components in the respective amounts reported in the below Table 1 were used. Particles size of oxygen-based compounds (MgO, ZnO, $ZrO_2$) had an average diameter in the range from 10 nm to 40 µm, preferably in the range of 1-10 µm, more preferably 2-5 µm as sold by Sigma-Aldrich. The preparation was carried out by using all the above ranges of the particle average diameter and following the same procedure.

TABLE 1

| Components | | Amount |
|---|---|---|
| 1. Demineralized $H_2O$ | | 60-90% by weight with respect to the total weight of components 1-7 |
| 2. MgO | Oxygen-containing compound | 5-20% by weight with respect to the total weight of components 1-7 |
| 3. ZnO | Oxygen-containing compound | 1-7% by weight with respect to the total weight of components 1-7 |
| 4. $ZrO_2$ | Oxygen-containing compound | 0.1-5% by weight with respect to the total weight of components 1-7 |
| 5. Agar Agar | Thickener additive | 0.1-3.5% by weight with respect to the total weight of components 1-7 |
| 6. Xanthan Gum | Thickener additive | 0.1-2% by weight with respect to the total weight of components 1-7 |
| 7. Methyl cellulose | Thickener additive | 0.1-2% by weight with respect to the total weight of components 1-7 |
| 8. Silicone | Plasticizer additive | 20-60% by weight with respect to the total weight of the gelled material obtained after step d) |

In a Becker demineralized water was poured and stirring was set between 200 and 400 rpm. The stirrer used was "AREX 630W", WELP SCIENTIFICA. In the becker MgO, ZnO and $ZrO_2$ were added in sequence, by waiting 5 minutes after adding each component. A final homogeneous aqueous solution was obtained. The solution was then heated up to a temperature in the range from 80 to 90° C. Components Agar Agar, xanthan gum and methyl cellulose were added simultaneously and the stirring was manually continued until an homogeneous solution was obtained. The latter was then left to cool down to ambient temperature at T in the range from 15 to 30° C. under manual stirring. A gelled material was obtained. Silicone was then added, and the product was manually stirred until an homogenous active material was obtained.

Without being bound to any theory the inventors deem that fluxing different selected gaseous species during the mixing procedure could enhance the final performances of the as obtained EPG, in terms of OCV, according to the series $N_2$>Air (wet)>Air (dry)>$O_2$ (dry)>$CO_2$ (dry).

Example 2

Preparation of the Active Material of the Invention

In order to prepare the active material the following components in the respective amounts reported in the below Table 2 were used. Particles size of oxygen-based compounds (MgO, ZnO, $ZrO_2$) had an average diameter in the range from 10-200 nm, preferably in the range of 15-100 nm, more preferably 20-40 nm as sold by US Research Nanomaterials, Inc. The preparation was carried out by using all the above ranges of the particle average diameter and following the same procedure.

TABLE 2

| Components | | Amount |
|---|---|---|
| 1. Demineralized $H_2O$ | | 60-90% by weight with respect to the total weight of components 1-7 |
| 2. MgO | Oxygen-containing compound | 5-20% by weight with respect to the total weight of components 1-7 |
| 3. ZnO | Oxygen-containing compound | 1-7% by weight with respect to the total weight of components 1-7 |
| 4. $ZrO_2$ | Oxygen-containing compound | 0.1-5% by weight with respect to the total weight of components 1-7 |
| 5. Agar Agar | Thickener additive | 0.1-3.5% by weight with respect to the total weight of components 1-7 |
| 6. Xanthan Gum | Thickener additive | 0.1-2% by weight with respect to the total weight of components 1-7 |
| 7. Methyl cellulose | Thickener additive | 0.1-2% by weight with respect to the total weight of components 1-7 |
| 8. Silicone | Plasticizer additive | 20-60% by weight with respect to the total weight of the gelled material obtained after step d) |

In a becker demineralized water was poured and stirring was set between 200 and 400 rpm. The stirrer used was "AREX 630W", WELP SCIENTIFICA. In the becker MgO, ZnO and $ZrO_2$ were added in sequence, by waiting 5 minutes after adding each component. A final homogeneous aqueous solution was obtained. The solution was then heated up to a temperature in the range from 80 to 90° C. Components Agar Agar, xanthan gum and methyl cellulose were added simultaneously and the stirring was manually continued until an homogeneous solution was obtained. The latter was then left to cool down to ambient temperature at T in the range from 15 to 30° C. under manual stirring. A gelled material was obtained. Silicone was then added, and the product was manually stirred until a homogenous active material was obtained.

Without being bound to any theory the inventors deem that fluxing different selected gaseous species during the mixing procedure could enhance the final performances of the as obtained EPG, in terms of OCV, according to the series $N_2$>Air (wet)>Air (dry)>$O_2$ (dry)>$CO_2$ (dry).

Example 3

Preparation of the Active Material of the Invention and Preparation of the Electric Power Generator (EPG)

In order to prepare the active material the following components in the respective amounts reported in the below Table 3 were used.

MgO powder had an average diameter from 10 nm to 40 µm, preferably in the range of 1-10 µm, more preferably 2-5 µm as sold by Sigma-Aldrich. The preparation was carried out by using all the above ranges of the particle average diameter and following the same procedure.

TABLE 3

| Components | | Amount |
|---|---|---|
| 1. Demineralized $H_2O$ | | 60-90% by weight with respect to the total weight of components 1-7 |
| 2. MgO | Oxygen-containing compound | 3-20% by weight with respect to the total weight of components 1-7 |
| 3. Casein | Water coordination additive | 0.1-20% by weight with respect to the total weight of components 1-7 |
| 4. Gum Arabic | Thickener additive | 0.1-5% by weight with respect to the total weight of components 1-7 |
| 5. Agar Agar | Thickener additive | 0.1-8% by weight with respect to the total weight of components 1-7 |
| 6. Xanthan Gum | Thickener additive | 0.1-4% by weight with respect to the total weight of components 1-7 |
| 7. Methyl cellulose | Thickener additive | 0.1-4% by weight with respect to the total weight of components 1-7 |
| 8. Silicone | Plasticizer additive | 20-60% by weight with respect to the total weight of the gelled material |

Here below the detailed description of the operating procedure taking into consideration intermediate amount of each chemical shown in table 3.

A solution 1 was prepared with the ingredients in the following table 4

TABLE 4

| ingredients of solution 1 | |
|---|---|
| Chemical | Amount [g] |
| MgO | 150 |
| Casein | 150 |
| Demineralized Water | 1500 |

MgO e casein reported in table 4 were mixed at ambient temperature until a homogeneous distribution between two solid state substances is reached. After that, demineralized water was added and the solution was heated up to 100° C. in a range of time varying from 20 to 40 minutes. The solution was mixed during this procedure to guarantee a complete and proper homogenization. Once the temperature of 100° C. is reached, the solution is maintained at this temperature for 5-10 min. The solution was then gradually cooled down to 40° C.

A solution 2 was prepared with ingredients of Table 5

TABLE 5

| ingredients of solution 2 | |
| --- | --- |
| Chemical | Amount [g] |
| Arabic gum | 50 |
| Demineralized water | 500 |

The solution 2 was heated up to 120° C. until the Gum Arabic was completed dissolved. After that, the solution was cooled up to 90° C. in order to add agar agar.

A solution 2b whose ingredients are reported in Table 6 was obtained.

TABLE 6

| ingredients of solution 2b | |
| --- | --- |
| Chemical | Amount [g] |
| Gum Arabic | 50 |
| Demineralized water | 500 |
| Agar Agar | 100 |

The Solution 1 at 40° C. was then mixed with Solution 2b at 90° C., thus obtaining Solution 3 (whose ingredients are reported in table 7).

TABLE 7

| ingredients of solution 3 | |
| --- | --- |
| Chemical | Temperature [° C.] |
| Solution 1 | 40 |
| Solution 2b | 90 |

Solution 3 was mixed in order to blend properly the two solutions. This mixture was maintained at 45° C. in order to avoid gelation phenomena.

To the solution 3 methyl cellulose and xanthan gum were added, thus obtaining the Solution 4, whose ingredients are reported in table 8:

TABLE 8

| ingredients of solution 4 | |
| --- | --- |
| Chemical | Amount [g] |
| MgO | 150 |
| Casein | 150 |
| Demineralized Water | 2000 |
| Gum Arabic | 50 |
| Agar Agar | 100 |
| Methyl cellulose | 30 |
| Xanthan gum | 20 |

This solution 4 was mixed for a minimum of 15 min. After that, Solution 4 was cooled down to ambient temperature for a minimum time period of 4 hours, thus removing any type of mixing action.

As soon as the temperature of 25° C. was reached, the Solution 4 was subjected to cooling cycles starting from ambient temperature to −18° C. Once this temperature was reached, Solution 4 was stabilized and maintained at 4° C. After that the solution 4 was weighted and an amount of 50% of its weight of silicone was added and manual agitation was performed in order to obtain an homogenous distribution of the plasticizer. A solution 5 reported in Table 8b was obtained.

TABLE 8b

| ingredients of solution 5 | |
| --- | --- |
| Chemical | Amount [g] |
| MgO | 150 |
| Casein | 150 |
| Demineralized Water | 2000 |
| Gum Arabic | 50 |
| Agar Agar | 100 |
| Methyl cellulose | 30 |
| Xanthan gum | 20 |
| Silicone | 1250 |

The solution 5 was used directly to prepare the electric power generator

Into a beaker containing the solution 5 (table 8b), two aluminum plates (10 cm×10 cm) were immersed, at a distance of 1 cm between them. The plates were connected to a 150 W power generator which provides 30 V. The applied potential was maintained until the current reaches a value below 30% of the initial value (5 A for an ideal case), after that the generator was switched off. This procedure allowed to obtain a uniform and homogeneous layer of active material on the aluminum plate connected to the positive pole. This plate was cooled then down to −18° C. for 1 hour and then kept at 4° C. for 1 hour.

In order to remove the residual water, the plate was heated up in an oven at 80° C. After this step the EPG was built up adding to the aluminum plate, treated as above described, the copper plate. Keeping the EPG at ambient temperature, a small pressure was exerted on it in order to favor the adhesion between each plate and the active material.

The same preparation procedure was carried out employing nanoparticle oxide powders with average diameter in the range from 10-200 nm, preferably in the range of 15-100 nm, more preferably 20-40 nm as sold by US Research Nanomaterials, Inc.

Without being bound to any theory the inventors deem that fluxing different selected gaseous species during the mixing procedure could enhance the final performances of the as obtained EPG, in terms of OCV, according to the series $N_2 >$ Air (wet) $>$ Air (dry) $> O_2$ (dry) $> CO_2$ (dry).

Example 4

Preparation of the Active Material of the Invention and Preparation of the Electric Power Generator (EPG)

In order to prepare the dry active material the following components in the respective amounts reported in the below Table 9 were used.

MgO powder had an average diameter from 10 nm to 40 μm, preferably in the range of 1-10 μm, more preferably 2-5 μm as sold by Sigma-Aldrich. The preparation was carried out by using all the above ranges of the particle average diameter and following the same procedure.

TABLE 9

| ingredients of example 3 | |
| --- | --- |
| Components | Amount |
| 1. Demineralized | 60-90% by weight with |

TABLE 9-continued ingredients of example 3

| Components | | Amount |
|---|---|---|
| H₂O | | respect to the total weight of components 1-7 |
| 2. MgO | Oxygen-containing compound | 4-20% by weight with respect to the total weight of components 1-7 |
| 3. Casein | Water coordination additive | 0.1-20% by weight with respect to the total weight of components 1-7 |
| 4. Gum Arabic | Thickener additive | 0.1-5% by weight with respect to the total weight of components 1-7 |
| 5. Agar Agar | Thickener additive | 0.1-8% by weight with respect to the total weight of components 1-7 |
| 6. Xanthan Gum | Thickener additive | 0.1-4% by weight with respect to the total weight of components 1-7 |
| 7. Methyl cellulose | Thickener additive | 0.1-4% by weight with respect to the total weight of components 1-7 |
| 8. Carnauba Wax | Plasticizer additive | 15-50% by weight with respect to the total weight of the gelled material |

Here below the detailed description of the operating procedure taking into consideration intermediate amount of each chemical shown in table.

The Solution 1 was prepared with the ingredients reported in Table 10:

TABLE 10 ingredients of solution 1

| Chemical | Amount [g] |
|---|---|
| MgO | 150 |
| Casein | 150 |
| Demineralized Water | 1500 |

MgO and casein were mixed at ambient temperature until a homogeneous distribution between two solid state substances was reached. Demineralized water was then added and the solution was heated up to 100° C. in a range of time varying from 20 to 40 minutes. The solution was mixed during this procedure to guarantee a complete and proper homogenization. Once the temperature of 100° C. was reached, the solution was maintained at this temperature for 5-10 min. The solution was gradually cooled down to 40° C.

The Solution 2 was prepared with the ingredients reported in Table 11.

TABLE 11 ingredients of solution 2

| Chemical | Amount [g] |
|---|---|
| Arabic gum | 50 |
| Demineralized water | 500 |

The solution 2 was heated up to 120° C. until the Arabic gum was completed dissolved. After that, the solution was cooled up to 90° C. in order to add agar agar. The solution 2b as reported in Table 12 was so obtained.

TABLE 12 ingredients of solution 2b

| Chemical | Amount [g] |
|---|---|
| Gum Arabic | 50 |
| Demineralized water | 500 |
| Agar Agar | 100 |

The solution 1 at 40° C. was mixed with solution 2b at 90° C., thus obtaining solution 3 (as reported in table 13).

TABLE 13 ingredients of solution 3

| Chemical | Temperature [° C.] |
|---|---|
| Solution 1 | 40 |
| Solution 2b | 90 |

Solution 3 was mixed in order to blend properly the two solutions. This mixture was maintained at 45° C. in order to avoid gelation phenomena.

Methyl cellulose and Xanthan gum were then added to the Solution 3, thus obtaining the solution 4:

TABLE 14 ingredients of solution 4

| Chemical | Amount [g] |
|---|---|
| MgO | 150 |
| Casein | 150 |
| Demineralized Water | 2000 |
| Gum Arabic | 50 |
| Agar Agar | 100 |
| Methyl cellulose | 30 |
| Xanthan gum | 20 |

The solution 4 (as reported in table 14) was mixed for a minimum of 15 min. After that, solution 4 was cooled down to ambient temperature for a minimum of 4 hours, removing any type of mixing action.

As soon as the temperature of 25° C. was reached, the solution 4 was subjected to cooling cycles starting from ambient temperature to −18° C. Once this temperature was reached, the solution 4 was stabilized and maintained at 4° C. After that solution 4 was maintained at ambient temperature for 24 hours.

An amount of 25% by weight with respect to the weight of the solution 4 of properly crumbled carnauba wax was added at ambient temperature to Solution 4 in order to obtain the solution 5 (table 15).

TABLE 15 ingredients of solution 5

| Chemical | Amount [g] |
|---|---|
| MgO | 150 |
| Casein | 150 |
| Demineralized Water | 2000 |
| Gum Arabic | 50 |
| Agar Agar | 100 |
| Methyl cellulose | 30 |
| Xanthan gum | 20 |
| Carnauba Wax | 625 |

The solution 5 (Table 15) was heated up to 78° C. providing both agitation and ultrasound application. Once solution becames homogeneous, the solution 6 was poured on the aluminum plate heated at 78° C. too. After this step, the aluminum plate was immersed into a beaker containing Dimethyl Sulfoxide (DMSO) in order to remove the remaining water.

Keeping constant temperature at 78° C., the EPG was built putting in contact the copper plate with the active material.

At this stage, a potential difference of 30 V was applied on EPG for different value of time depending on the temperature:
- 5 minutes for T=78° C.
- 5 minutes for T=70° C.
- 10 minutes for T=60° C.
- 10 minutes for T=50° C.
- 10 minutes for T=40° C.
- 30 minutes for T=30° C.
- 10 minutes for T=25° C.
- 30 minutes for T=−18° C.

The same preparation procedure was carried out employing nanoparticle oxide powders with average diameter in the range from 10-200 nm, preferably in the range of 15-100 nm, more preferably 20-40 nm as sold by US Research Nanomaterials, Inc. The preparation was carried out by using all the above ranges of the particle average diameter and following the same procedure.

Without being bound to any theory the inventors deem that fluxing different selected gaseous species during the mixing procedure could enhance the final performances of the as obtained EPG, in terms of OCV, according to the series $N_2$>Air (wet)>Air (dry)>$O_2$ (dry)>$CO_2$ (dry).

Example 5

Assembling of an Electric Power Generator Having Two Electrodes.

Two squared electrodes, respectively made of Cu and Al and having the same area (about 25 $cm^2$) were cleaned and etched in order to be used for assembling the electric power generator. The active material obtained by the Example 1 using oxides powders with average diameter of 2-5 was then deposited on the surface of Cu electrode with doctor blade technique. The thickness of the active material was about 2 mm and the electrode of Al was placed on top of the deposited active material in a parallel way with respect to the Cu electrode. The two electrodes were gently pressed together assuring a uniform contact of the active material with their own surface. The product so obtained was baked for 20 minutes at 80° C. in order to dry the active material, thus obtaining a solid electric power generator. The generator of the invention so obtained was then stored at a temperature from 15 to 18° C. for a time period of 12-24 hours before testing it.

The baking process was performed to eliminate the excess water but to guarantee that it still present, as absorbed coordinated water, in a percentage of at least 1% respect to the active material's total mass.

Example 6

Electrical Characterization of the Electric Power Generator.

The EPG of Example 5 was electrically characterized by using AMEL2553 potentiostat/galvanostat. The electrical circuit is reported in FIG. 2.

Figure 2:
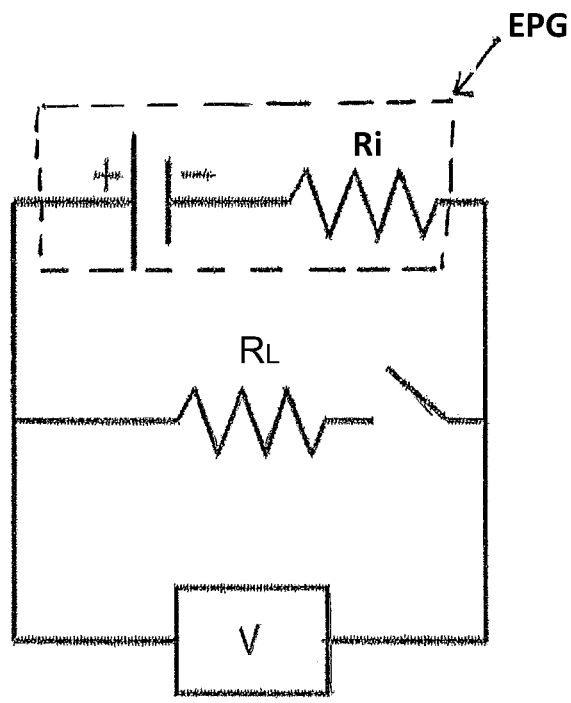
FIG. 2 shows an example of an electrical circuit comprising the electric power generator according to the present invention.

From FIG. 2, it is shown the EPG is a generator, providing a current in, coupled with its own internal resistance (Ri). The latter is normally defined as a ratio between the open circuit potential and the short circuit current. The load resistance ($R_L$) was connected in series to the electric power generator of Example 5. The voltage was monitored by connecting the galvanostat parallel to the load resistance. The source resistance (Ri) is strongly dependent on the components of the active material. The internal resistance was measured following the "voltage divider procedure": Different load resistances were applied to the EPG until a voltage of an half with respect to the open circuit one was reached after some minutes. In this way, a "voltage divider" is created with two equal series load resistances, namely the internal one (Ri) and the load resistance ($R_L$). Through this procedure, the internal resistance (Ri) was estimated to be between 1 and 100 KOhm. The resistance $R_{EPG}$ measured between the electrodes had an average value of 1.2-1.6 MΩ. The active material resulted to have a low conductivity. The electric power generator was characterized by running a potentiometric analysis setting a null current (open voltage). On the contrary, closing the circuit the current flowed through the load resistance ($R_L$). The amount of current was measured from the value of the voltage measured divided by $R_L$=100Ω.

Example 7

Thermal Characterization of the Electric Power Generator.

The circuit scheme reported in FIG. 2 comprising the electric power generator of Example 5 was tested at ambient temperature (18-20° C.). The test consisted in a 5 minutes open voltage measurement followed by two hour with the circuit closed.

Figure 3:
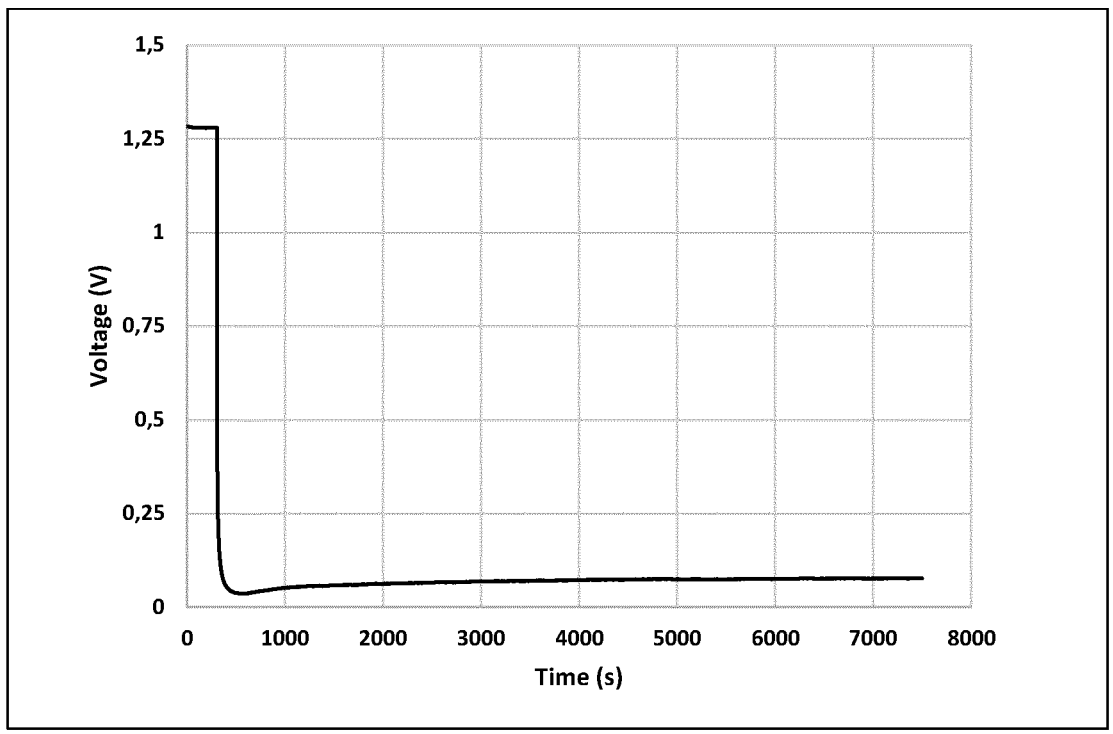
FIG. 3 shows the curve of the result of the tests carried out in example 4.
Figure 4:
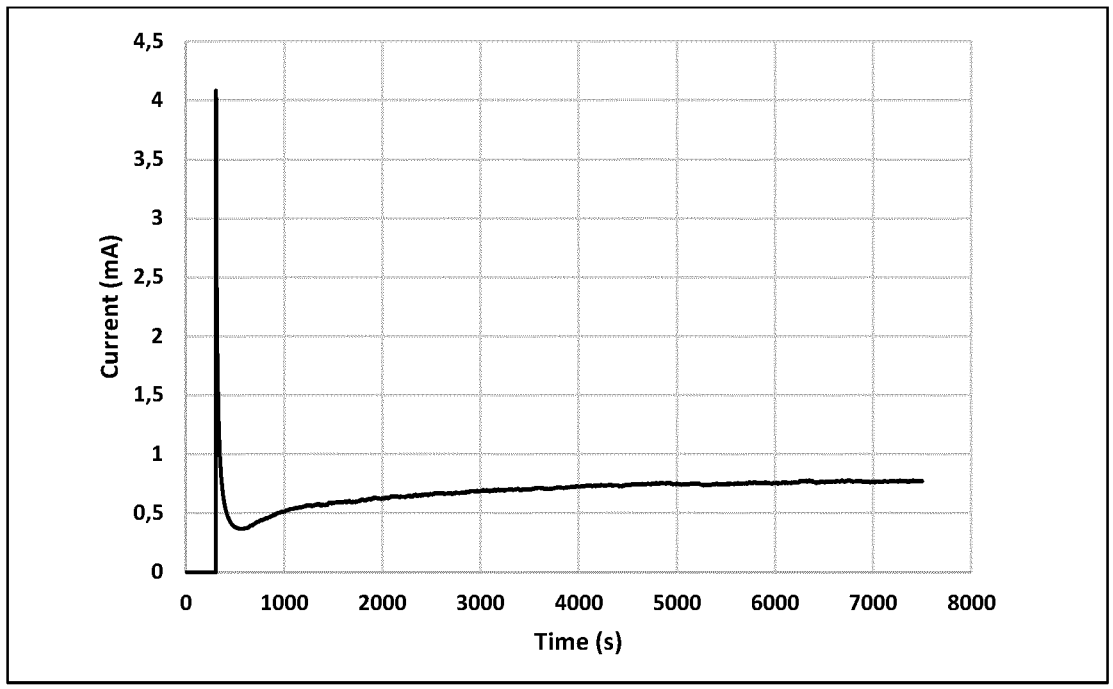
FIG. 4 shows the curve of the results of the test carried out in example 4.

The curves reported in FIGS. 3 and 4 were obtained. With reference to FIGS. 3 and 4, three different regions were observed:
1) a first region characteristic of a condition of "open circuit"; in such region, the voltage was constant and the average open circuit voltage (OCV) measured for all EPGs fabricated was 1.2-1.4 V prior to testing. No current was measured (open circuit);
2) a second region characteristic of a "transition" between the open circuit condition and a closed circuit condition; as soon as the circuit was closed the voltage dropped abruptly and constantly reduced in time until a minimum was reached (transition region); in the transition region the current increased to a maximum value (1-1.2 mA);
3) a third region characteristic of a condition of "closed circuit"; in the third region the current generated by the EPG increased with time although the EPG was "discharging" and stabilized to a given value, i.e. I=0.5-1 mA.

Example 8

Thermal Characterization of the Electric Power Generator.

Figure 5:
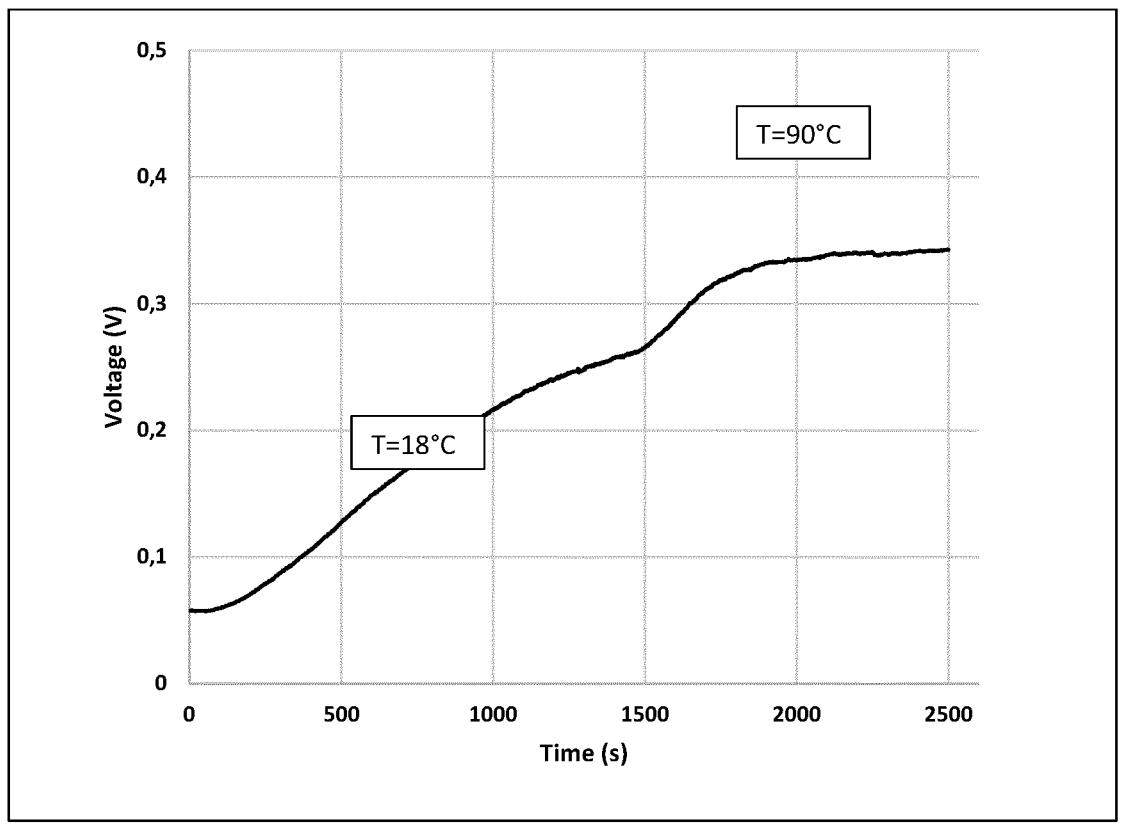
FIG. 5 shows the curve of the result of the tests carried out in example 5.
Figure 6:
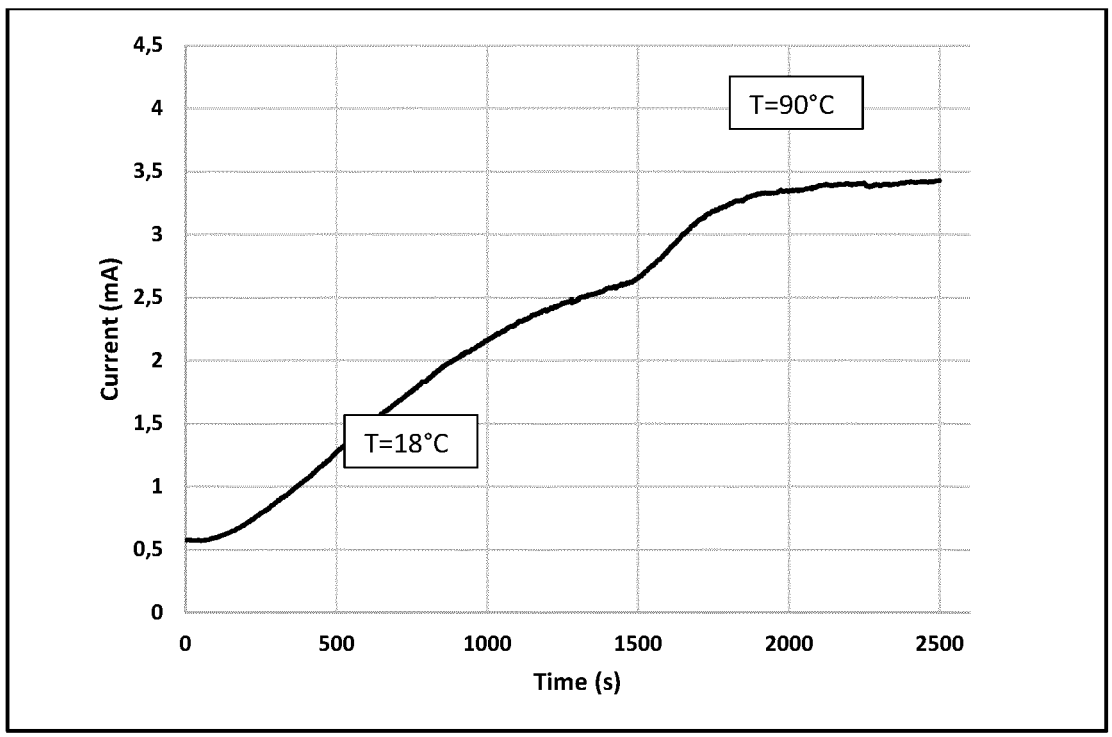
FIG. 6 shows the curve of the results of the test carried out in example 5.

The circuit scheme reported in FIG. 2 comprising the electric power generator of Example 5 was tested for temperature dependence (20-90° C.). The test consisted in heating the EPG with the aid of a heater or by immerging the electric power generator in a liquid under stirring. Temperature was monitored with a thermographic camera (FLIR Exx series) or with a mercury-in-glass thermometer in case of a heating bath. In this example, mercury-in-glass thermometer was chosen. The electric power generator was heated up to 90° C. after having let the electric power generator for 1 hour at 20° C. with a 100Ω load in order to stabilize the current. The curves reported in FIGS. 5 and 6 were obtained.

After 1 hour at 20° C. under load, the EPG stabilized at about 0.57 mA; the current reached about 3.5 mA at T=90° C.

Figure 7:
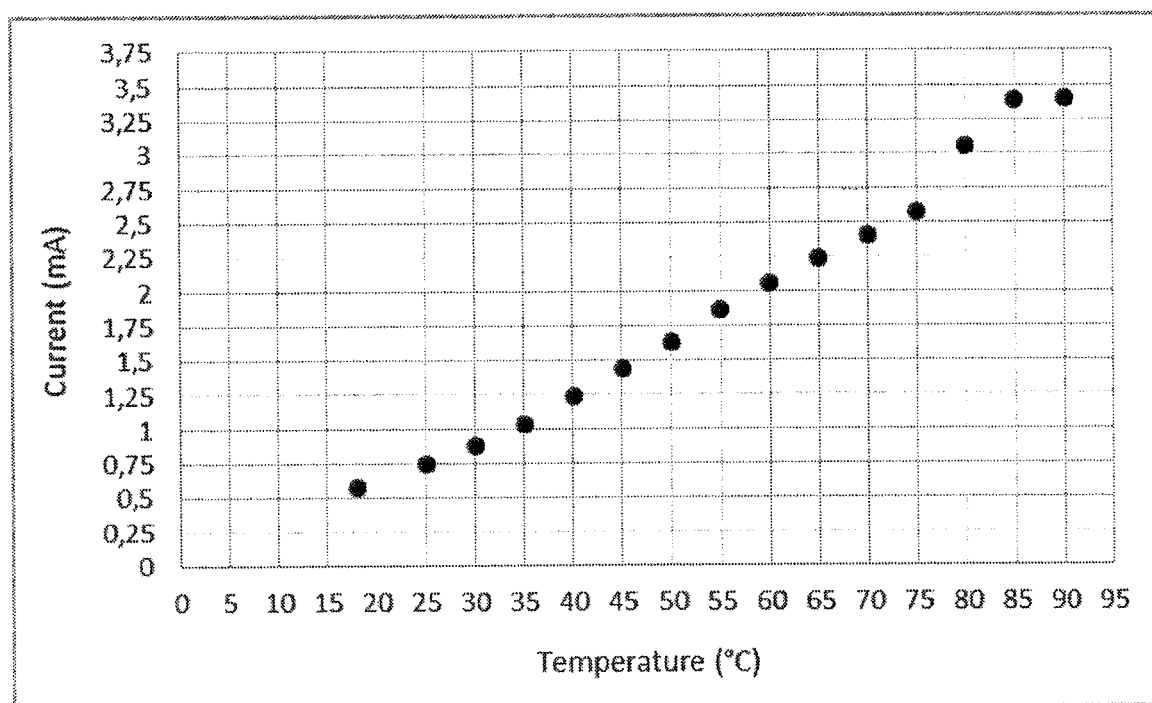
FIG. 7 shows the curve current temperature dependence in the test carried out in Example 5.

The circuit scheme reported in FIG. 2 comprising the electric power generator of Example 5 was tested at different temperature conditions. Temperature was constantly monitored and the curve current temperature dependence reported in FIG. 7 was obtained. More precisely, the curve in FIG. 7 shows the values of current measured at different temperature conditions with the circuit scheme of FIG. 2 in a closed condition.

Example 9

An electric power generator EPG as reported in Example 5 was assembled by using electrodes made of the same material, namely Cu—Cu. Active medium as in the Example 1 has been used with a 2 mm thickness. The electrodes area was 9 cm².

Figure 8:
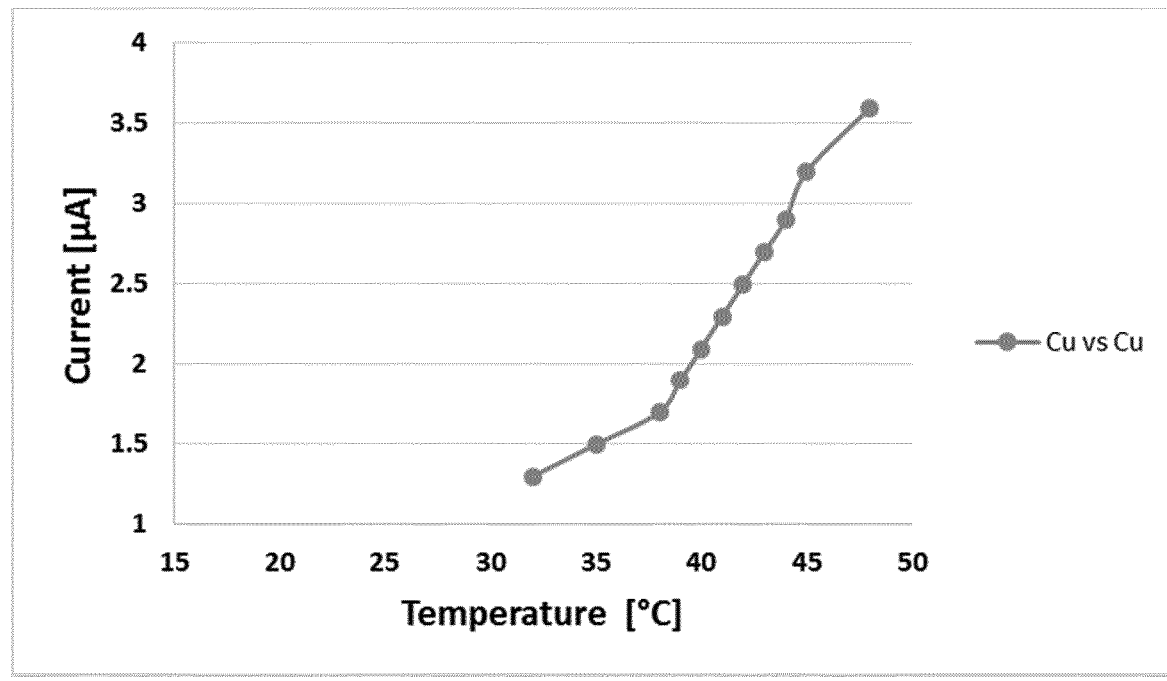
FIG. 8 shows the curve of the results of the test carried out in example 6.

FIG. 8 shows the current evolution as a function of the temperature. It is worth to notice that also this test showed an increase of the current generated by the EPG with the temperature. However, such an increase in in the order of μA and not of mA as in the Example 8.

Example 10

Figure 9:
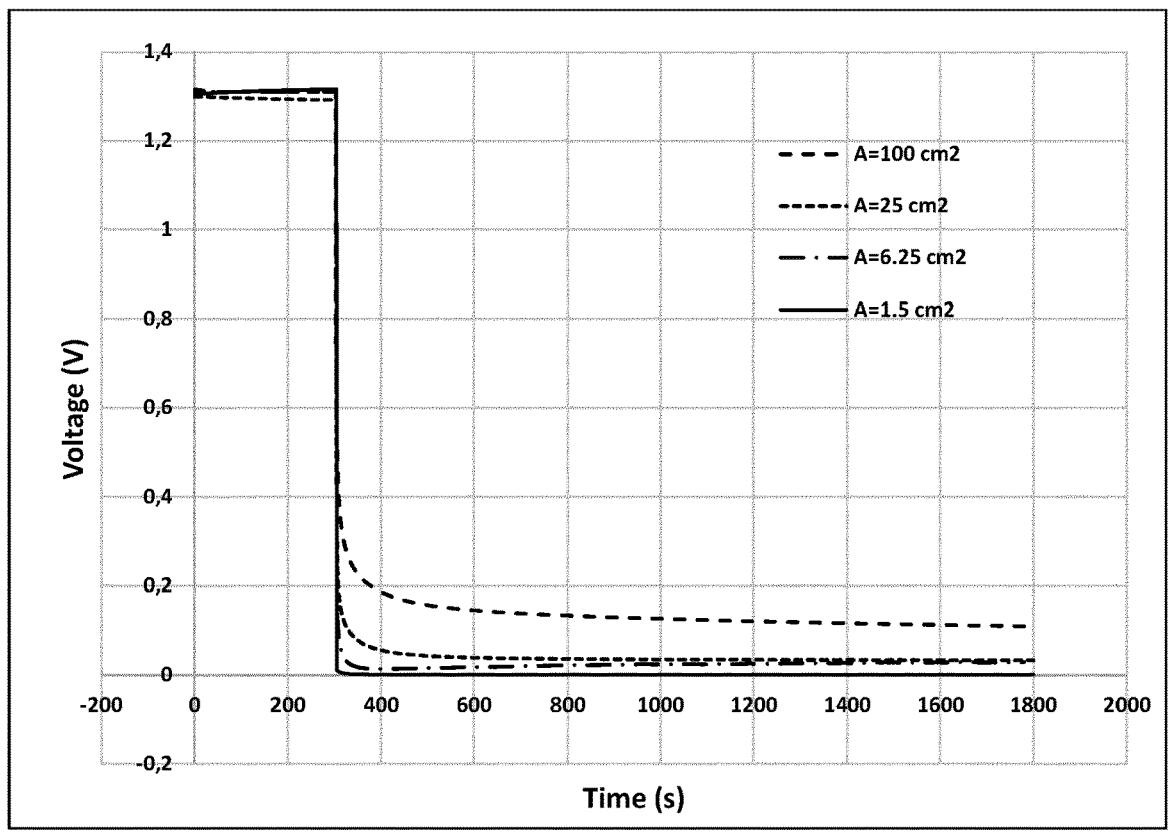
FIG. 9 shows the curve of the results of the test carried out in example 7.

An EPG as reported in Example 5 was assembled by using electrodes having higher area (1.5, 6.25, 25 and 100 cm²). The current generated was proportional to the electrode area: the bigger the area, the higher the current produced. FIG. 9 shows a curve of the EPG performance depending on the electrodes area. The other parameters of the EPG (thickness, active medium composition, electrodes material) are kept constant as in Example 5.

Example 11

Figure 10:
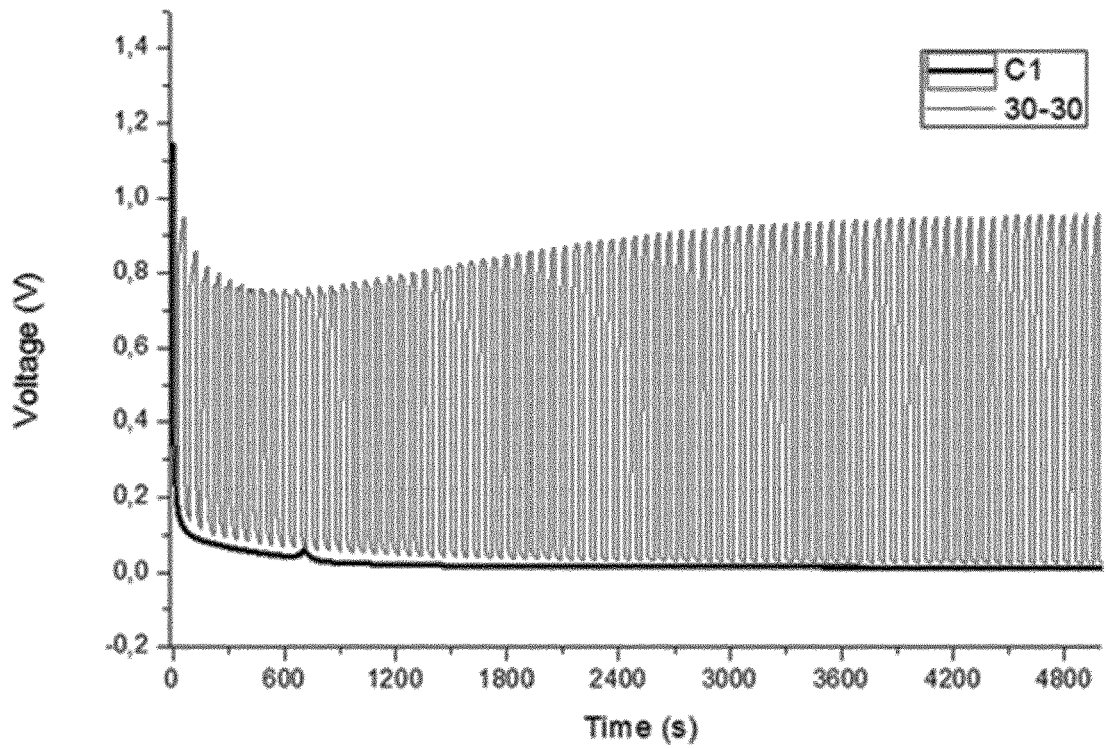
FIG. 10 shows the curve of the results of the test carried out in example 8.

The possibility of working with alternate discharge has been evaluated for an EPG having the features as in the Example 5, namely thickness, active medium, composition, electrodes material, electrodes area as in the Example 5. In FIG. 10, a continuous discharge (curve C1) is compared with an alternate discharge (curve 30-30). Both the curves refer to the tested EPG. The alternate discharge comprises 30 seconds of working and 30 seconds of rest. In the 30 seconds of working, an external load resistance is applied and the circuit is closed. In the 30 seconds of rest, the circuit is open and the load resistance is removed. In both cases (continuous and alternate discharge) a load resistance of 100Ω has been applied. An evaluation is performed comparing both the "active working times" (ON states) and the effective times of each tests. The expression "ON STATE" wants to indicate a working period in which the load resistance is applied. In the specific case, this condition occurred cyclically every 30 seconds. For the following 30 seconds, the load resistance was disconnected (OFF STATE) from the EPG by means of a releé. Alternate discharge was evaluated also for different ON and OFF times in the range of 2-60 seconds.

FIG. 10 shows that the performances (in term of current discharged) are greatly improved with the alternate discharge. During the rest phase, the EPG partially shows a recovery effect, namely a temporary recover of voltage (V) when the load resistance is not applied to the EPG. It is worth to notice that, during the OFF STATE, it was possible to apply a voltage and/or current at the EPG electrodes so as to increase the voltage and consequently the current discharge thereby. Such a procedure can be actually used after each test or anytime the EPG is disconnected from the load resistance.

Example 12

The EPG shows a strong sensibility to the working condition e.g. environment. The presence of water and oxygen seemed to decrease the lifetime of the EPG. Preliminary tests have been performed on EPGs prepared according to the Example 5 to evaluate the requirement of a proper sealing to extend the device lifetime. For this purpose, the EPGs have been tested with a potentiostat/galvanostat AMEL2553. The test consists in applying a discharge current of 100 μA; EPGs have been discharge from the nominal voltage to 0.8V subsequently followed by 45 minutes of rest I=0 μA to evaluate the recovery. With exception of the sealing step, the two EPGs have been fabricated with the same route as in Example 5 with standard electrodes dimensions 25 cm². In the first case, the EPG has not been sealed allowing the interaction with the atmosphere; in the second case the EPG has been completely sealed by immersion in silicone.

Figure 11:
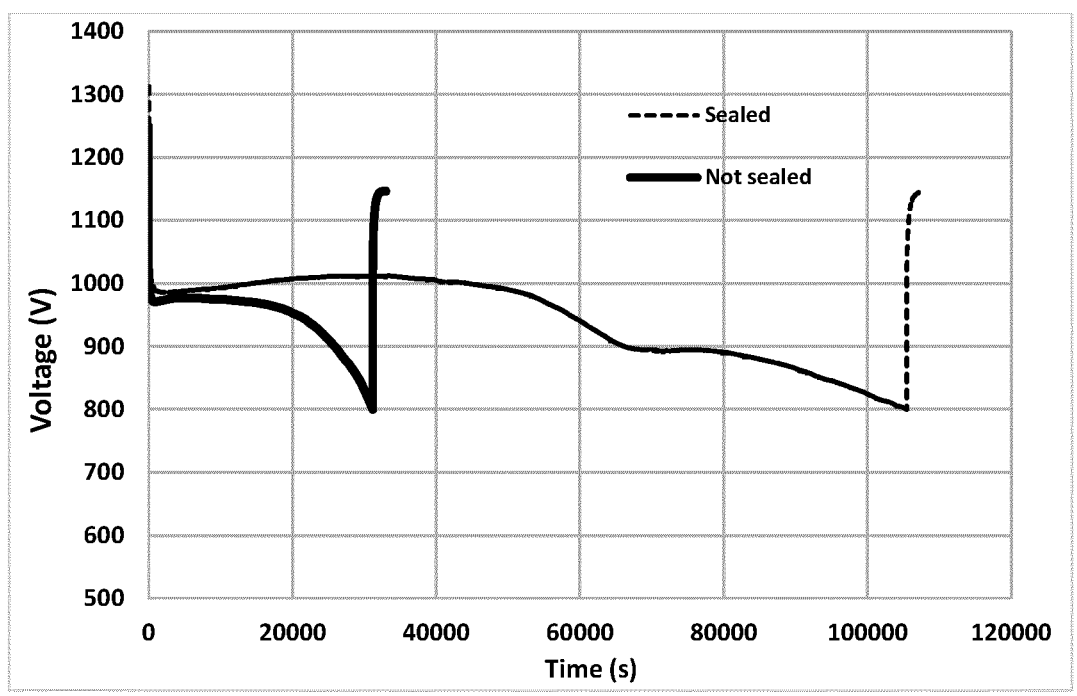
FIG. 11 shows the curves of the results of the test carried out in example 9.

FIG. 11 shows the curves of the EPG performance depending on the sealing. On the tested EPGs a relative lifetime extension of 400% is observed; higher OCV voltage is measured for the sealed EPG prior the application of a discharge current.

It is important to notice that these tests have been carried on a standard formulation, containing a relatively high water content. Sealing effect is expected to be higher on an optimized one, containing a lower amount of water. In addition, large improvements in sealing quality is expected.

Example 13

Particle size of the oxygen-based compounds (MgO, ZnO, $ZrO_2$) affects the overall performances of the EPG. In fact, the smaller the particles dimension the higher the active surface area for a given material volume. The effect of particle dimension has been investigated comparing EPGs performances for micrometric and nanometric oxygen-based particles as obtained according to the formulation of Example 1 and Example 2 and following the procedure of Example 5, EPG electrodes area is 25 cm². For this purpose, the EPGs have been tested with a potentiostat/galvanostat AMEL2553. The test consisted in applying a discharge current of 100 μA; EPGs have been discharge from the nominal voltage to 0.8 V subsequently followed by 45 minutes of rest I=0 μA to evaluate the recovery.

The use of nanoparticle extends the EPG relative lifetime more than 200% with respect to the micrometric formulation. A higher OCV voltage has been also observed.

Example 14

Assembling multiples EPGs according to specific configurations as in the Example 5 results in the enhancement of the power generated above at least of 10%. In the test considered, the current is measured using a multimeter. In this experiment, ten EPGs connected in series are considered. In the first configuration, the EPGs are disposed side by side; the electrodes of different EPGs are not in physical contact but are electrically connected by means of a copper wire. In the second configuration, the EPGs are piled up preferably maintaining the connection wires, preferably putting in contact the surface of copper and aluminum of adjacent EPGs. The latter configuration has shown a current of I=15 mA while for the former I=13 mA has been measured.

Example 15

Figure 12A:
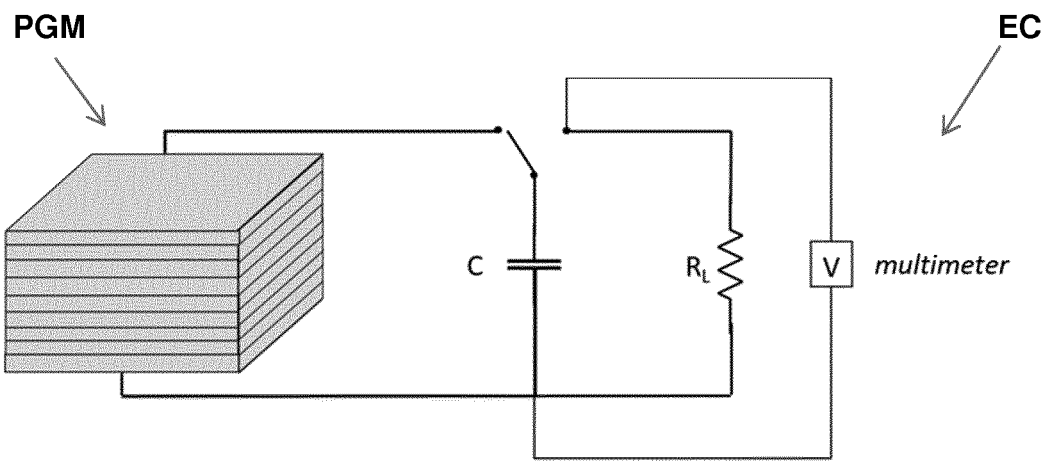
FIGS. 12A and 12B show a circuit comprising the PGM of the invention according to example 15, respectively during charging phase (FIG. 12A) and discharging phase (FIG. 12B)
Figure 12B:
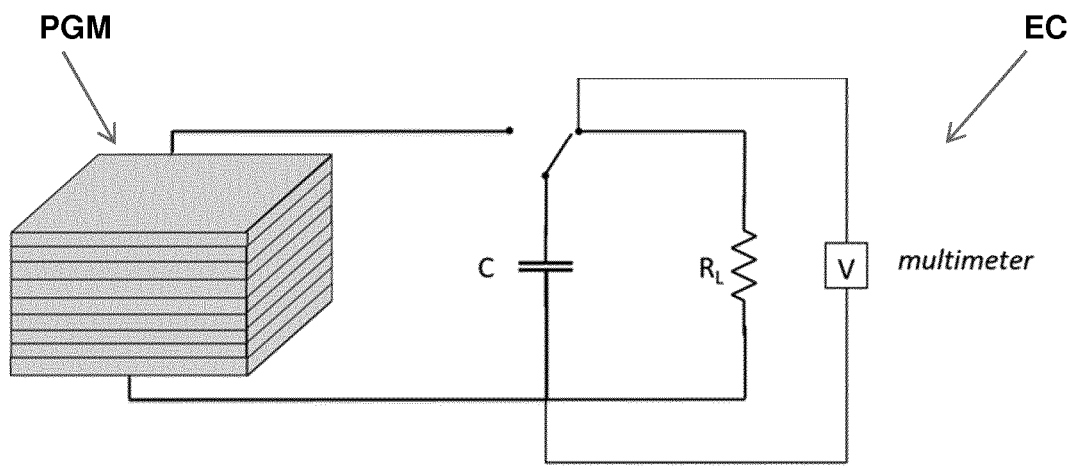
Figure 13:
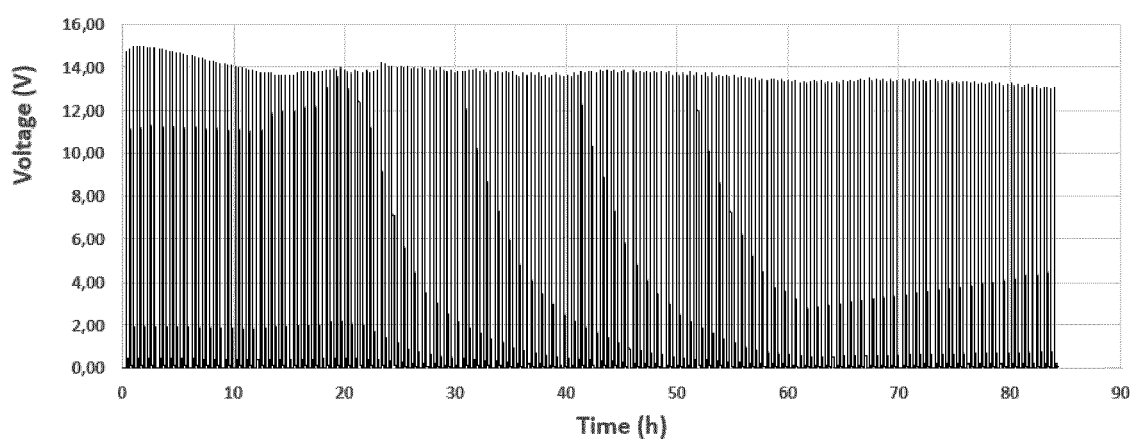
FIG. 13 shows the OCV values for the capacitor immediately at the beginning of the OFF state of example 16.

In another embodiment of the invention, it has been demonstrated that the EPG is able to supply current, charging a capacitor C comprised in a suitable circuit. As shown in the circuit in FIG. 12A is connected in series with a capacitor C with initial voltage Vi=0 V. A "cell" can be an EPG (as depicted in FIG. 2) or can be a PGM, namely a plurality of EPG connected in series as depicted in FIGS. 12A and 12B. The cell is connected in series to the capacitor C by a switch SW in a first switching state. During a charge phase (FIG. 12A), the EPG charges the capacitor up to an equilibrium voltage. Once the capacitor C is charged, a switch is activated (second switching state) for connecting the capacitor to an arbitrary resistor so as to discharge the capacitor (discharge phase or "rest phase"); the cell is now electrically isolated (FIG. 12B). With the term "resistor" is generally meant an electric resistor, a diode, a combination thereof, or any electrical component able to discharge the capacitor C when the switch SW is in said second switching state.

The energy stored in the capacitor C is calculated from characteristic capacity and the charged voltage (Vc), measured by means of a multimeter; an electrochemical capacitor is employed in this setup. In one of the test carried out, a temporized switch is used to alternate charge of the capacitor C and the rest phase where the cell is electrically isolated, in this phase voltage cell recover occurs. During this rest phase (configuration B) the capacitor connected in series with an arbitrary resistor (RL) with the only purpose to discharge it completely prior the beginning of the next charge cycle, the discharge curve of the capacitor C is monitored by means of a multimeter.

Example 16

The possibility of charging a capacitor working in alternate discharge conditions has been evaluated for an PGM (power generator module) assembled according to materials and methods reported in Example 5.

The electrical circuit EC is reported in FIGS. 12A and 12B, with a load resistance $R_L$ of 150 KOhm and an PGM comprising 15 EPGs connected in series, resulting in a total OCV of 15.3 V.

The alternate discharge comprises 10 minutes of working (charge phase) and 10 minutes of rest (rest phase). However, different ON-OFF times could be arbitrarily applied. In the 10 minutes of working the circuit was closed and capacitor was charged by the PGM. In the 10 minutes of rest, the circuit was open and the capacitor was discharged by the resistance. The expression "ON STATE" wanted to indicate a working period in which capacitor was charged. In the specific case, this condition occurred cyclically every 10 minutes. For the following 10 minutes, the capacitor was disconnected (OFF STATE) from the PGM and discharged by the $R_L$.

This kind of experiment was performed on 500 μF capacitors. FIG. 14 shows the OCV values for the capacitor immediately at the beginning of the OFF state.

The test was performed for 256 cycles, resulting in an average OCV of 13.3 V. In table 16 are summarized values for the power supplied by the PGM consisting of 15 EPGs in series as well as energy densities, computed considering the effective working time of 42.6 h.

TABLE 16

| PGM power and energy densities values | | | |
| --- | --- | --- | --- |
| W | Wh | Wh/L | Wh/Kg |
| 7.4 E−5 | 3.14E−3 | 8.61E−03 | 2.97E−03 |

The electric power (W) was calculated considering the energy (E) required to charge a capacitor of capacity (C) at given voltage (V) within the time considered (t) according to the general formula:

$$W=E/t[J/s]=[W]$$

where the energy is calculated according to the expression defined for a parallel plate capacitor $$E=\frac{1}{2}CV^2$$

The measures are also reported considering the energy (Wh) as it was supplied at constant rate over a period of time in hour (h). The volume and the weight of the PGM, respectively expressed in liters (L) and kilograms (Kg), are used to calculate the energy density (Wh/L) and the specific energy (Wh/Kg): for these calculations, weight and volume are referred to the entire EPG comprising of metallic electrodes, not only to the active material.

The invention claimed is:

1. An electric power generator (EPG) comprising at least a first electrode (11) and a second electrode (12), wherein the electric power generator comprises an active material between said electrodes (11,12), wherein the active material comprises at least one oxygen-containing compound selected from the group consisting of MgO, ZnO, $ZrOCl_2$, $ZrO_2$, $SiO_2$, $Bi_2O_3$, $Al_2O_3$ and $TiO_2$; at least one thickener additive selected from the group consisting of agar agar, xanthan gum, methylcellulose, and arabic gum; and at least one plasticizer additive, wherein the particle size of the at least one oxygen-based compound has an average diameter in the range from 10 nm to 40 μm, and wherein the first electrode and the second electrode directly contact the active material.

2. The electric power generator (EPG) of claim 1, wherein said electrodes are made of different materials.

3. The electric power generator (EPG) of claim 1, wherein said electrodes are made of the same material.

4. The electric power generator (EPG) of claim 2, wherein said first electrode (11) is made of copper and wherein said second electrode is made of aluminum.

5. The electric power generator (EPG) of claim 3, wherein said electrodes are made of copper.

6. The electric power generator (EPG) of claim 1, wherein said electrodes are made of a material selected in a group consisting of metals, alloys and carbon based materials.

7. A power generator module (PGM) characterized in that it comprises a plurality of electric power generators (EPGs) of claim 1, wherein said generators are connected in parallel or in series.

8. A power generator module (PGM) of claim 7, wherein when said EPGs are connected in series, the electrodes of different EPGs are electrically connected by a conductive wire.

9. A power generator module (PGM) of claim 7, wherein when said EPGs are connected in series, wherein a surface of an electrode of a first EPG is in contact with a surface of a second EPG.

10. An electric circuit (EC) comprising an EPG of claim 1, wherein said circuit (EC) also comprises, a capacitor (C), a resistor ($R_L$) and a switch (SW) and wherein:
in a first switching state, said switch (SW) connects said capacitor (C) in series with said EPG; and
in a second switching state, said switch (SW) connects said capacitor (C) in series with said resistor ($R_L$).

11. An electric circuit (EC) comprising an PGM of claim 7, wherein said circuit (EC) also comprises, a capacitor (C), a resistor ($R_L$) and a switch (SW) and wherein:
in a first switching state, said switch (SW) connects said capacitor (C) in series with said PGM; and
in a second switching state, said switch (SW) connects said capacitor (C) in series with said resistor ($R_L$).

12. The electric power generator (EPG) according to claim 1, wherein the at least one oxygen-containing compound has an average particle diameter in the range of 15 nm-10 μm.

13. The electric power generator (EPG) according to claim 1, wherein the at least one oxygen-containing compound has an average particle diameter in the range from 10 to 200 nm.

14. The electric power generator (EPG) according to claim 1, wherein the at least one oxygen-containing compound is MgO, in the range from 3% and 17% with respect to the total weight of the active material.

15. The electric power generator (EPG) according to claim 1, wherein the at least one oxygen-containing compound is ZnO or $ZrO_2$.

16. The electric power generator (EPG) according to claim 15, wherein the at least one oxygen-containing compound is in the range from 0.7% and 10% with respect to the total weight of the active material.

17. The electric power generator (EPG) according to claim 1, wherein the at least one thickener additive is selected from the group consisting of agar agar, xanthan gum, and methylcellulose.

18. The electric power generator (EPG) according to claim 17, wherein the at least one thickener additive is in the range from 0.19% and 6.5% with respect to the total weight of the active material.

19. The electric power generator (EPG) according to claim 1, wherein the at least one plasticizer additive is selected from the group consisting of silicone, siloxanes, carnauba wax, Naphtalene, PVDF, Parylene, PTFE, FEP and PDMS.

20. The electric power generator (EPG) according to claim 1, wherein the active material comprises silicone in an amount in the range from 5% to 40% with respect to the total weight of the active material.

21. The electric power generator (EPG) according to claim 1, wherein:
the at least one oxygen-containing compound comprises MgO, ZnO, and $ZrO_2$,
the at least one thickener additive comprises agar agar, xanthan gum, and methylcellulose, and
the at least one plasticizer additive comprises silicone.

22. The electric power generator (EPG) according to claim 13 wherein the at least one oxygen-containing compound has an average particle diameter in the range of 15-100 nm.

23. The electric power generator (EPG) according to claim 22, wherein the at least one oxygen-containing compound has an average particle diameter in the range of 20-40 nm.

* * * * *